United States Patent
Roman et al.

(10) Patent No.: US 7,071,701 B2
(45) Date of Patent: Jul. 4, 2006

(54) ONLINE FIBER OPTIC SENSOR FOR DETECTING PARTIAL DISCHARGE AND SIMILAR EVENTS IN LARGE UTILITY STATION TRANSFORMERS AND THE LIKE

(75) Inventors: Harry T. Roman, East Orange, NJ (US); Kenneth Rudolph Farmer, II, Lake Elmo, MN (US); Xiaodong Wang, East Newark, NJ (US); Baoqing Li, Harrison, NJ (US)

(73) Assignee: New Jersey Institute of Technology, Newark, NJ (US)

(*) Notice: Subject to any disclaimer, the term of this patent is extended or adjusted under 35 U.S.C. 154(b) by 130 days.

(21) Appl. No.: 10/794,177

(22) Filed: Mar. 5, 2004

(65) Prior Publication Data

US 2005/0194979 A1 Sep. 8, 2005

(51) Int. Cl.
*G01R 31/08* (2006.01)
*G01R 31/308* (2006.01)

(52) U.S. Cl. .................. 324/536; 324/547; 324/753; 73/602

(58) Field of Classification Search .................. 324/536
See application file for complete search history.

(56) References Cited

U.S. PATENT DOCUMENTS

| 4,654,806 | A | * | 3/1987 | Poyser et al. | 324/726 |
| H0536 | H | * | 10/1988 | Strickland et al. | 324/536 |
| 5,214,595 | A | * | 5/1993 | Ozawa et al. | 324/536 |
| 5,530,366 | A | * | 6/1996 | Nasrallah | 324/536 |
| 6,496,265 | B1 | * | 12/2002 | Duncan et al. | 356/479 |
| 6,528,985 | B1 | * | 3/2003 | Greuel et al. | 324/158.1 |
| 6,774,639 | B1 | * | 8/2004 | Unsworth | 324/536 |

FOREIGN PATENT DOCUMENTS

EP 241764 A1 * 10/1987
WO WO 94/28566 12/1994

OTHER PUBLICATIONS

C. E. Statler et al., Design And Fabrication Of A Miniature Pressure Sensor Head Using Direct Bonded Ultra-Thin Silicon Wafers, Proceedings of IEEE MEMS, 1996, pp. 239-243.

M. H. Beggans et al., Optical Pressure Sensor Head Fabrication Using Ultra-Thin Silicon Wafer Anodic Bonding, Proceedings of SPIE 1999 International Symposium on Design.

International Search Report, Written Opinion, Dec. 1, 2005.

* cited by examiner

*Primary Examiner*—Anjan Deb
*Assistant Examiner*—Timothy J. Dole
(74) *Attorney, Agent, or Firm*—Kaplan, Gilman, Gibson & Dernier L.L.P.

(57) ABSTRACT

An approved method and apparatus for detecting partial discharge events within a transformer comprises asserting a MEMS acoustical probe through the wall of the transformer to optically measure partial discharge events. In an enhanced embodiment, temperature compensation is also possible, and detection may be confirmed via an independent electromagnetic or other sensor.

9 Claims, 7 Drawing Sheets

ONLINE FIBER OPTIC SENSOR FOR DETECTING PARTIAL DISCHARGE AND SIMILAR EVENTS IN LARGE UTILITY STATION TRANSFORMERS AND THE LIKE

TECHNICAL FIELD

This invention relates to sensing devices, and more particularly, to an improved online continuous monitoring and sensing device with particular application to the monitoring of large utility station transformers.

BACKGROUND OF THE INVENTION

Large utility station transformers are an integral part of modern day electricity transmission and distribution systems. These critical pieces of equipment represent a tremendous investment of time and cost on the part of the utility companies. Additionally, failure of such transformers can result in many millions of dollars worth of economic damage, even if such failures are only for a short duration.

As a result of the large investment and high cost of any down time, transformers are periodically monitored for potential partial discharge activity within. Typically, such "spot" monitoring, as it is known, is accomplished by temporarily equipping the external casing of the transformer with a plurality of sensors that sense acoustic noise caused by a partial discharge or other event inside the transformer. This spot monitoring is conducted intermittently, on request, and usually over a period of several days or even weeks.

Several drawbacks with such prior techniques exist. First, because the external sensors are mounted on the outside of the transmission case and locate partial discharge events via triangulation, accuracy is diminished. Second, the monitoring only occurs at the relatively infrequent periods that the sensors are utilized. Third, the process of spot monitoring is typically sold to the utility companies by third party entities, and thus tends to be relatively expensive.

It is an object of the invention to provide a reliable and relatively inexpensive method to continuously monitor partial discharge events in transformers and the like.

It is an object of the invention to provide instantaneous and continuous monitoring and feedback of partial discharge event information within transformers and the like.

It is an object of the invention to be able to compensate for environmental variations within the transformer that could affect the detection of partial discharge events.

The foregoing and other objects of the present invention will be clear upon review of the following description and drawings.

SUMMARY OF THE INVENTION

The above and other problems of the prior art are overcome in accordance with the present invention which relates to an online, preferably fiber optic based, Micro Electro Mechanical System (MEMS) acoustic pressure sensor device that is capable of detecting partial discharge events directly within the utility transformer and providing constant feedback. In accordance with the invention, acoustical energy is detected and analyzed via a sensor, preferably an optical sensor. The signature of the acoustical energy is then compared with the signature of acoustical energy expected in response to a partial discharge event, wherein such expected signature may be preferably altered based upon parameters such as temperature within the transformer. When a match between the expected signature and the sensed signature is detected, a partial discharge event is identified and reported.

DETAILED DESCRIPTION OF THE PREFERRED EMBODIMENT

Figure 1:
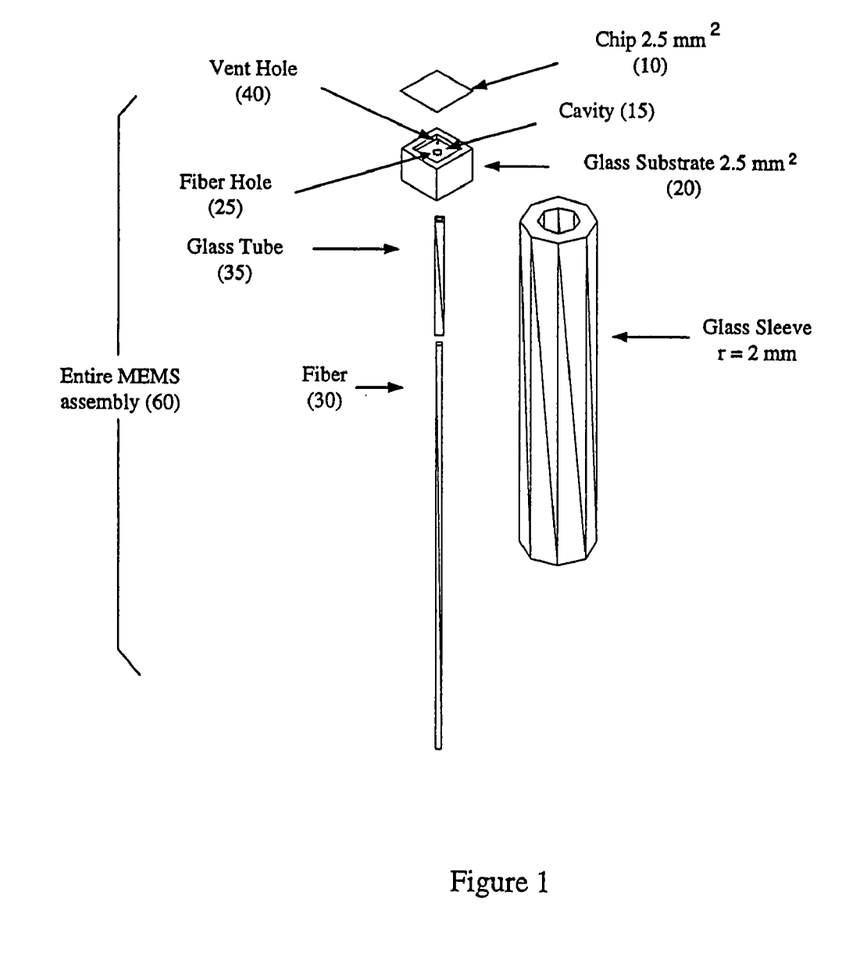
FIG. 1 depicts an assembly diagram showing the parts of an exemplary sensor in accordance with the present invention.

FIG. 1 shows a Micro Electro-Mechanical System (MEMS) sensor. The MEMS sensor 10 sits in a lip edged cavity 15 which supports the edges of the MEMS sensor 10 and permits vibration of the MEMS sensor in and out of the cavity in response to acoustical energy detected. A glass substrate 20 is utilized to form the cavity and hold the sensor 10.

An opening 25 is provided beneath the sensor 10 within the substrate for permitting insertion of an optical fiber 30 as shown. Optionally, the fiber itself may be protected within an additional outer tube or casing shown as 35 in FIG. 1. A vent hole 40 is provided in order to permit gas to be injected underneath the inserted MEMS sensor 10 and provide pressure between the bottom of cavity 15 and the MEMS sensor 10. This additional pressure may be utilized to compensate for deflection of the sensor toward the bottom of cavity 15 that could be caused by static pressures within the environment in which the sensor is utilized. Such static pressures could be caused, for example, by oil pressure within the transformer being monitored if the entire apparatus were submerged.

Figure 2:
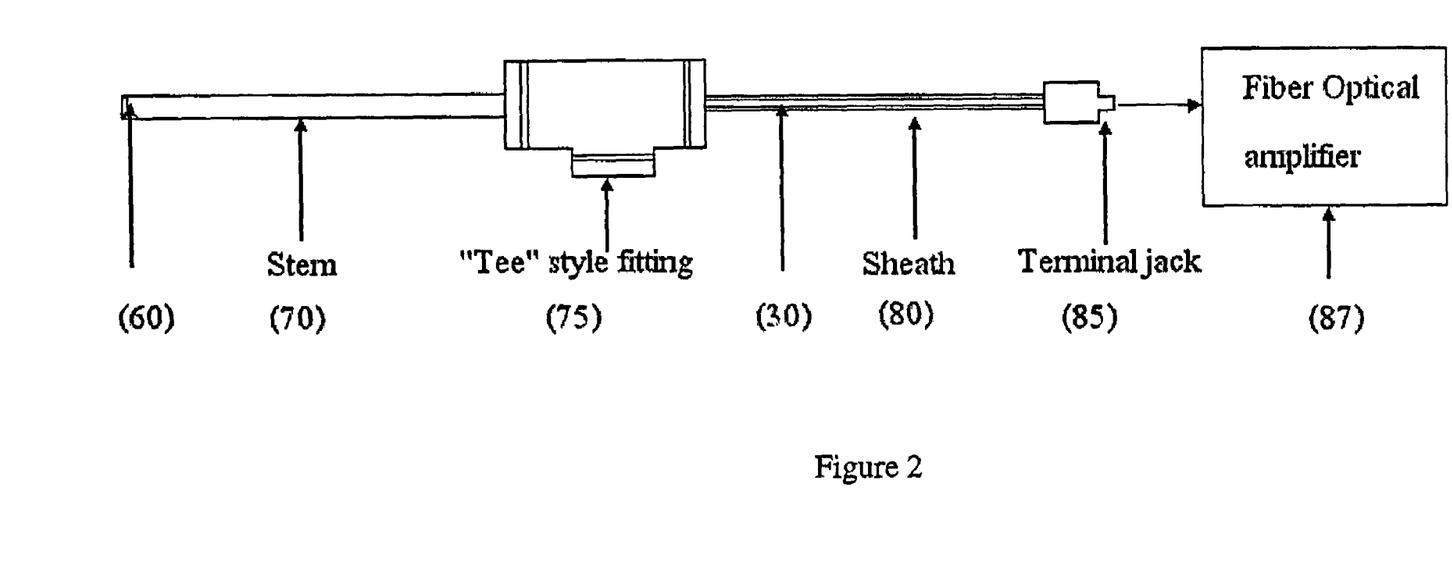
FIG. 2 depicts an assembled sensor in accordance with the present invention.

FIG. 2 shows the assembled MEMS sensor mounted in the probe style assembly for insertion through the side wall of a large utility transformer. The assembled MEMS sensor of FIG. 1 is mounted within the stem 70 shown in FIG. 2 as indicated. Optimally, the stem 70 is made from stainless steel or similar material. A "tee" style fitting 75 with compression joints may be used to secure the stem 70 and provide a point of connection for the fiber optic cable 30 that will convey measurements optically to the fiber optical amplifier 87 as shown. A length of the stem 70 is chosen preferably to permit the MEMS sensor to be immersed within the volume of insulating oil present in most transformers. Based upon typical dimensions of such apparatus, a reasonable range of length for a stem 70 would be approximately 7 to 18 inches long, depending upon transformer design and the location on the sidewall at which the probe would be inserted.

Figure 3:
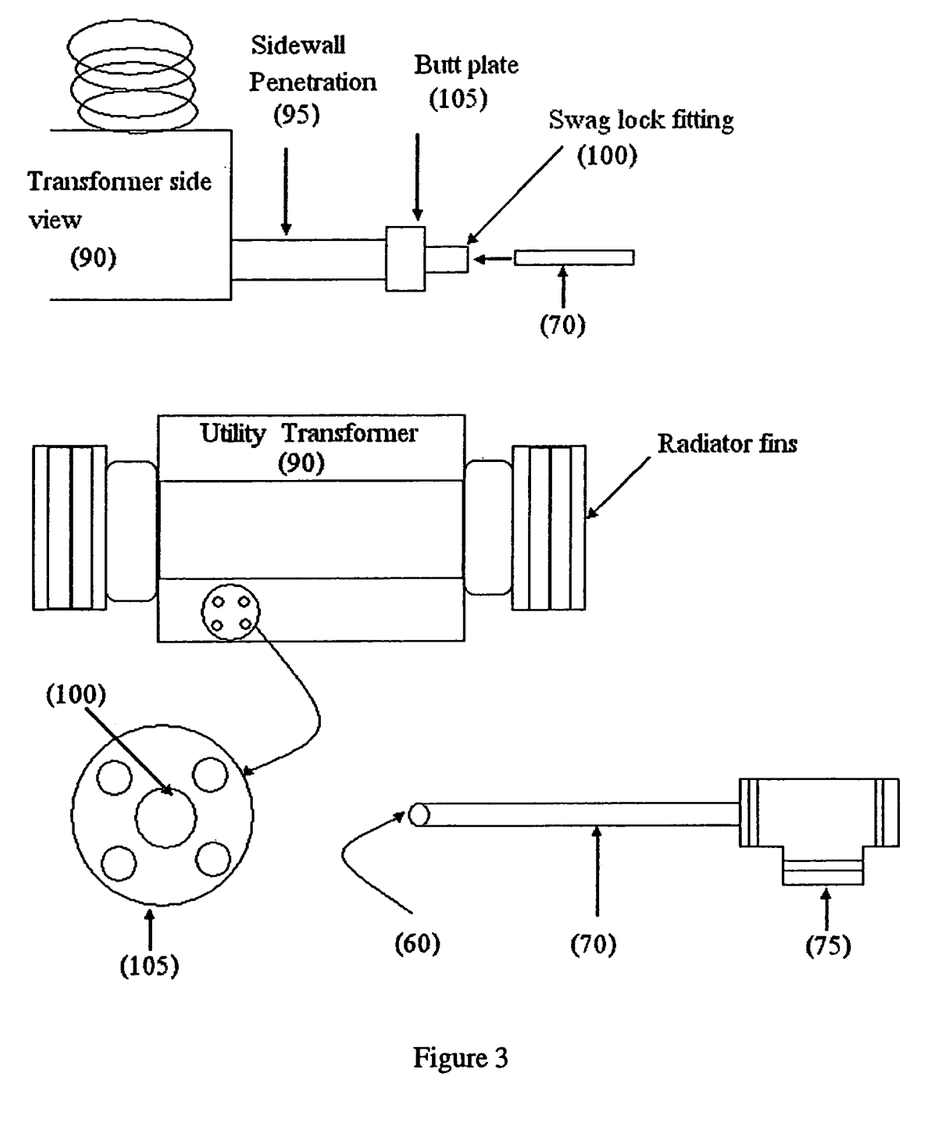
FIG. 3 shows the installation of the sensor of the present invention with an exemplary transformer.
Figure 5:
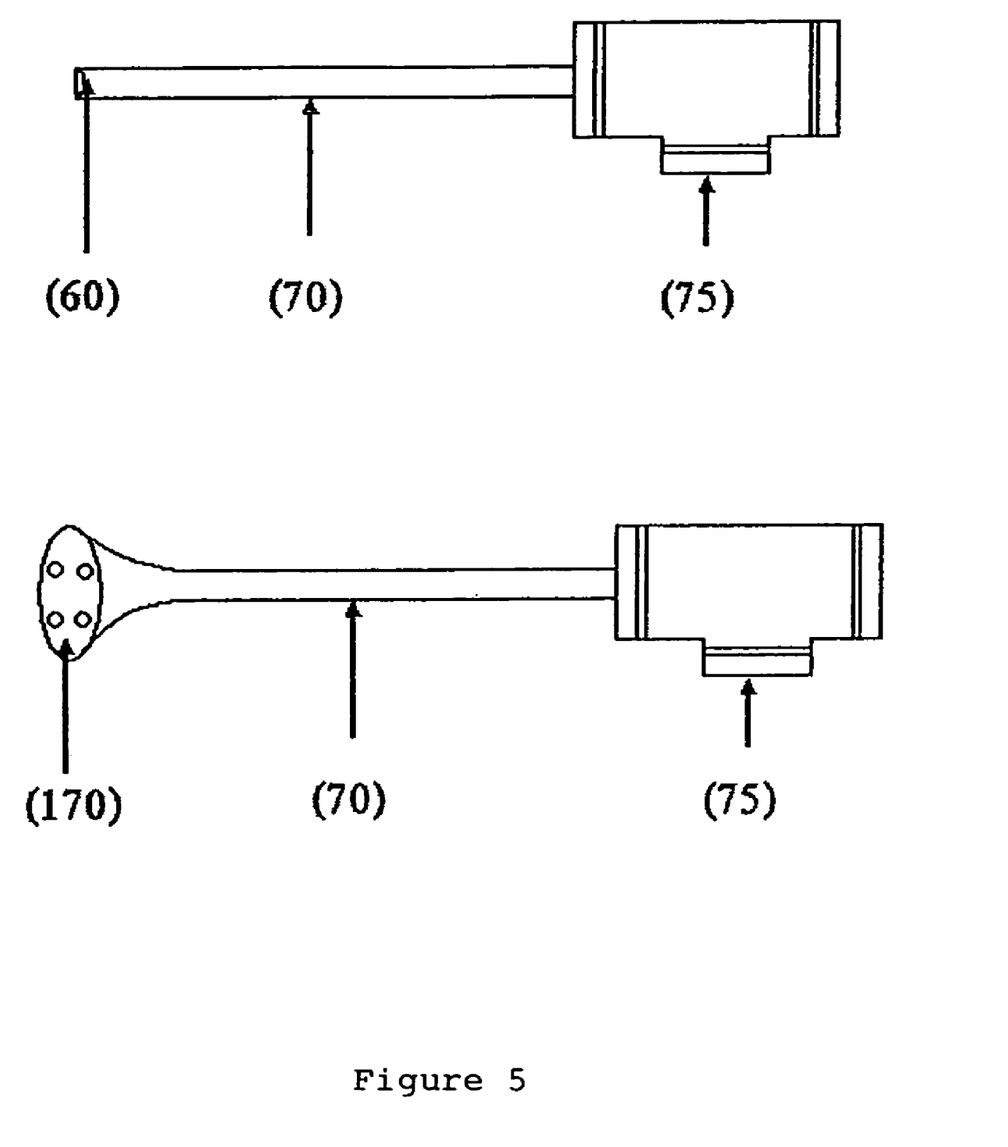
FIG. 5 depicts an additional embodiment of the invention wherein plural MEMs sensors are mounted within a single probe.

In operation, partial discharge event acoustical signals vibrate a sensor 10. Variations in the optical signal are transmitted to fiber optical amplifier 87 for further analysis. FIG. 3 depicts an exemplary installation of the probe of FIG. 2 installed within a transformer side 90. The probe style device 70 containing the MEMS sensor 60 is installed in a utility station transformer through one of the sidewall tank penetrations 95 typically provided by transformer manufacturers. Alternatively, the sensor may be installed through existing oil drain valves, or drilled openings added to the transformer in the field. The probe may optimally enter via a swage-lock fitting 100 drilled through a buck plate 105 as indicated in the figure. In one embodiment, multiple probe style devices of the type described herein may be utilized in corresponding multiple sidewall penetrations in the transformer to allow for the triangulation of sensors in an attempt to locate the source of the partial discharge event in three-dimensional space. Alternatively, it is possible that plural sensors may be located within one probe as shown in FIG. 5 at location 170. Sensors and probes may also be inserted through the top of the transformer, to work in conjunction with the sidewall inserted sensors and probes. New transformers may be equipped with similar devices or other related fiber optic devices operating on the same principles, and installed during the initial manufacture of the transformers.

Figure 4:
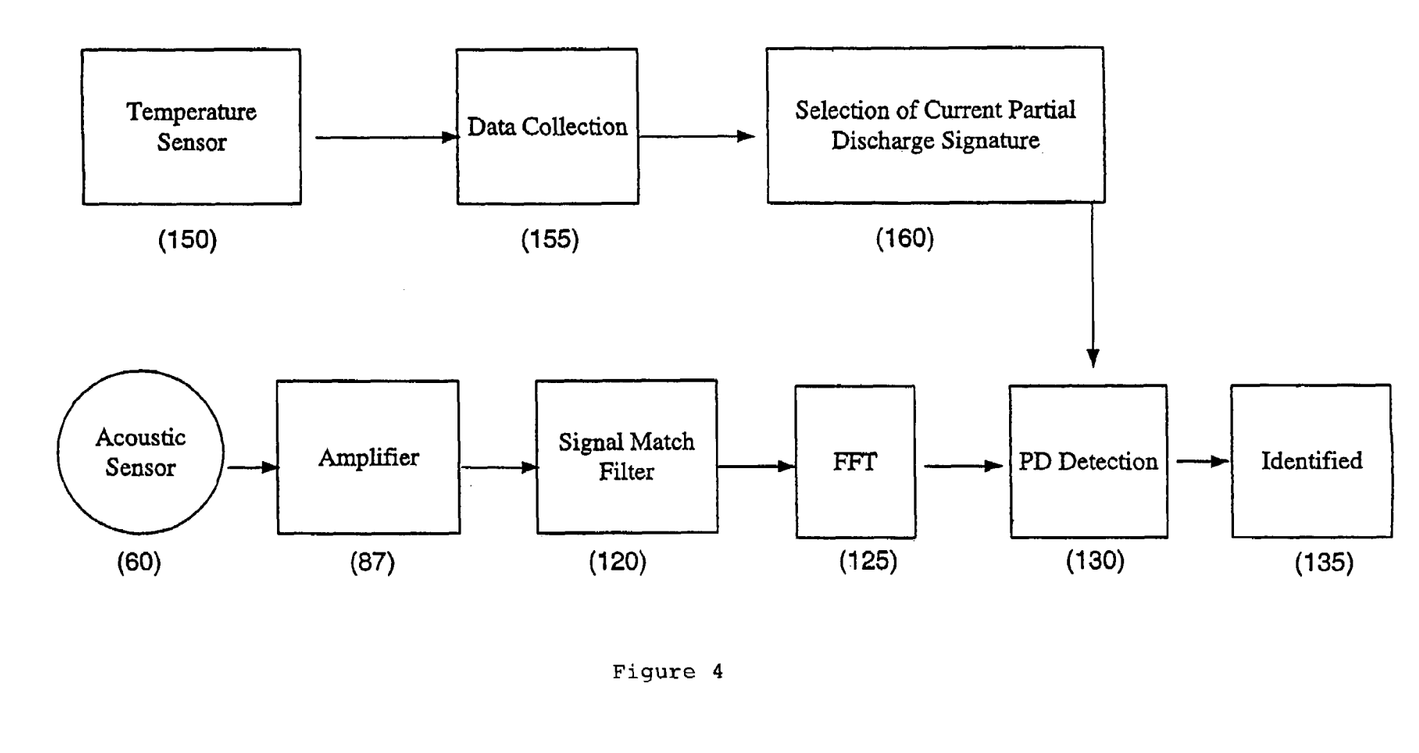
FIG. 4 depicts an exemplary embodiment of the procedures for processing signals collected by the sensors and detecting partial discharge events.

FIG. 4 depicts a block diagram of the basic procedures to be carried out in detecting and identifying partial discharge events in accordance with the present invention.

Prior to the processes depicted in FIG. 4 being executed, the "signature" of partial discharge events is stored. The signature represents, in one simple form, the frequency spectrum emitted when a partial discharge event occurs. The ability to detect such events may be enhanced by using more advanced signal processing techniques known to those in the art such as the Hilbert-Huang Transforms, Fourier analysis, or other similar signal processing techniques. Such mathematical algorithms are typically used for geologic exploration, ultrasound analysis, and other similar areas.

In accordance with the invention, the acoustic sensor 60 transmits to information through an amplifier 87 as indicated. Signal match filter 120 filters the signal and passes it to a fast fourier transform (FFT) algorithm 125, the output of which represents the frequency spectrum of the signal. The Hilbert Huang transform may be used as a preconditioner to the FFT analysis. The frequency spectrum is considered one form of signature of the particular signal detected. Temperature sensor 150, data collection clock 155 and selection block 160 serve to compensate for the changes reflected in the signature under different temperature conditions. More specifically, the signature emitted by a particular partial discharge event will vary based upon temperature. Such variations calculated empirically are shown below:

| Temperature/Frequency (Hz) | 25° C. | 40° C. | Ratio |
|---|---|---|---|
| 0–50k | 42.91% | 43.83% | 1.02 |
| 50k–100k | 41.68% | 33.95% | 0.81 |
| 100k–150k | 10.09% | 13.76% | 1.36 |
| 150k–200k | 3.64% | 5.34% | 1.47 |
| 200k–250k | 1.11% | 1.63% | 1.47 |
| 250k–300k | 0.40% | 0.68% | 1.70 |
| 300k–350k | 0.09% | 0.33% | 3.67 |
| 350k–400k | 0.08% | 0.48% | 6.00 |

Block 160 selects the appropriate signature to which the sensed signature should be compared, based upon the present temperature. A simple methodology for accomplishing this function is to store a library of signatures in selection block 160, each corresponding to a different temperature, and then output to the PD selection block 130

The selected signature is then compared to the sensed signature from acoustic sensor 60 at PD detection block 130, and a match results in the identification of a partial discharge event as indicated at 135.

FIG. 5 depicts an additional embodiment of the invention in which a single probe 70 may hold plural MEMS or other sensors such that plural sensors are "listening" for potential partial discharge events. The use of plural sensors permits the location of the partial discharge event within the transformer to be ascertained via, for example, triangulation or other trigonometric techniques known in the art. It is noted that if more than three such sensors are used, additional accuracy is possible.

Figure 6:
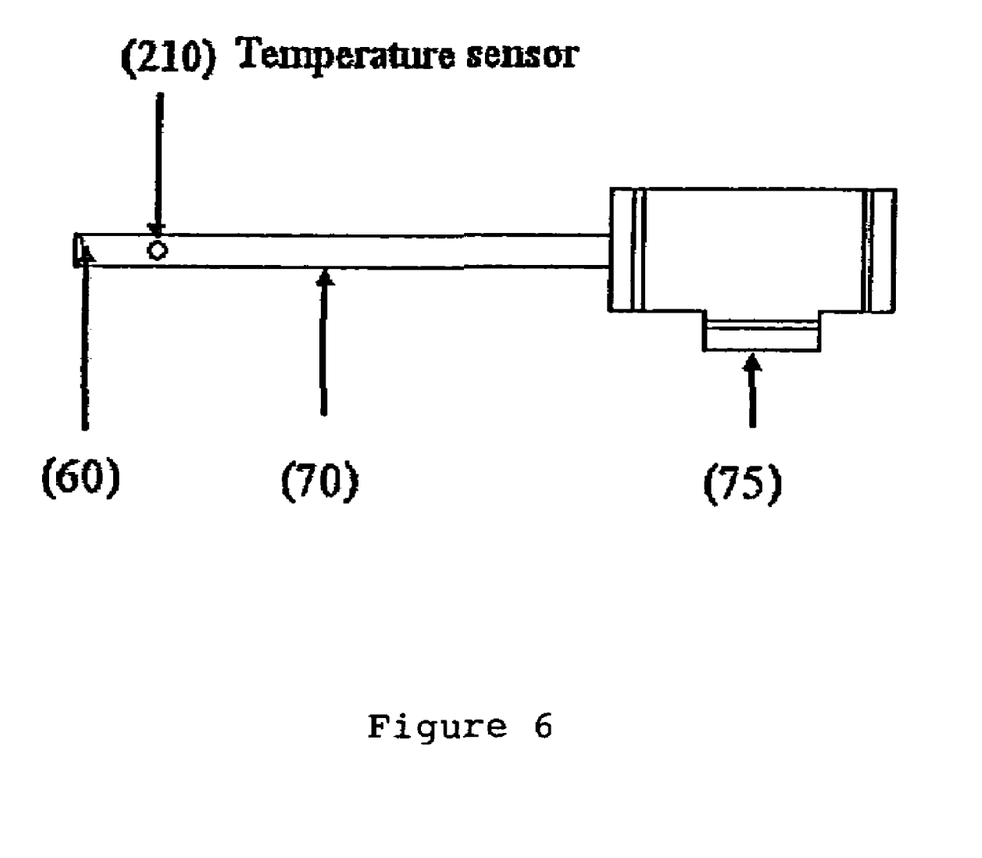
FIG. 6 shows a still further embodiment wherein a temperature sensor is integrated with a probe.

The invention may utilize a single temperature probe or multiple temperature probes in combination with a single or multiple MEMS probes. FIG. 6 shows an additional embodiment of the present invention in which a MEMS probe 70, similar to that of the prior embodiment, is utilized, however, an additional temperature sensor 210 is installed directly within the MEMS probe. Thus, a single physical probe can be used to both measure partial discharge events and compensate for temperature. Alternatively, one or more temperature sensors may be employed on different probes.

Figure 7:
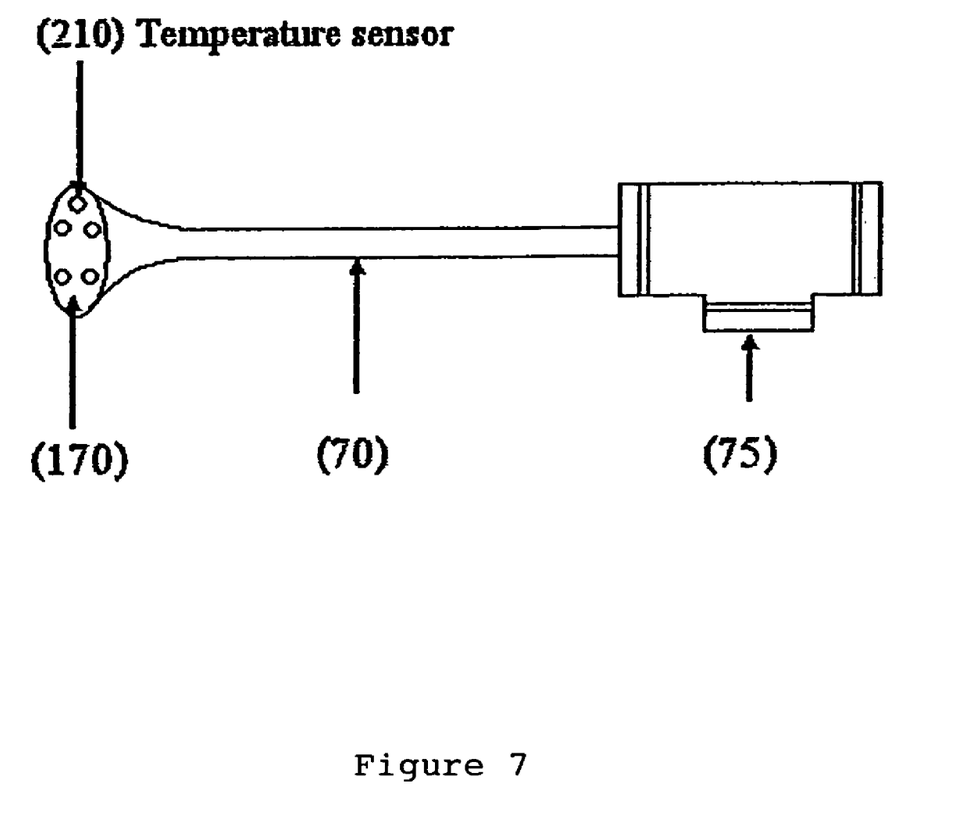
FIG. 7 shows an alternative embodiment wherein a single probe holds a temperature sensor and plural MEMS sensors.

FIG. 7 depicts a single temperature sensor 210 integrated into a probe 70 with a plurality of MEMS sensors. This embodiment permits a single probe to be mounted on the transformer to measure partial discharge events, locate them, and compensate for temperature changes.

It is also noted that an independent electromagnetic probe may also be inserted into the system. Partial discharge events have emanating from them both an acoustic signature and an electromagnetic signature. The comparison of the two detectors may be utilized to confirm the event, since acoustic emissions due to thermal heating, bubbles bursting, or other dynamic activities within the transformer oil would not have an accompanying electromagnetic signature. The electromagnetic sensor may be built into the same probe that includes the MEMS sensor, or may be separately implemented.

While the foregoing describes the preferred embodiments of the present invention, various modifications will be apparent to those of skill in the art. Such modifications are intended to be covered by the following claims.

The invention claimed is:

1. Apparatus for detecting partial discharge events comprising a detection circuit for detecting acoustical signatures resulting from a partial discharge event, a plurality of stored signatures for comparing said acoustical signatures to said stored signatures, and an output for signaling detection of a partial discharge event when said detected acoustical signature matches at least one stored signature wherein said at least one stored signature is selected for comparison to said detected signature based upon temperature of an environment in which said apparatus is operating.

2. Apparatus of claim 1 further comprising a temperature sensor.

3. Apparatus of claim 2 further comprising plural detection circuits for detecting said event, and a processor for trigonometrically locating said event.

4. The apparatus of claim 2 wherein said temperature sensor is integrated with said detection circuit.

5. The apparatus of claim 1 further comprising an electromagnetic sensor for detecting partial discharge events, and a processor for comparing signals detected at said electromagnetic sensor to signals detected at said detection circuit.

6. The apparatus of claim 3 wherein said detection circuit is an optical detection circuit.

7. The apparatus of claim 1 wherein plural detection circuits are integrated into a single probe.

8. The apparatus of claim 7 wherein said plural detection circuits comprise at least one circuit for detecting electromagnetic energy and at least one circuit for detecting acoustic energy.

9. The apparatus of claim 8 further comprising at least one temperature sensor.

\* \* \* \* \*

UNITED STATES PATENT AND TRADEMARK OFFICE
CERTIFICATE OF CORRECTION

PATENT NO.         : 7,071,701 B2
APPLICATION NO. : 10/794177
DATED              : July 4, 2006
INVENTOR(S)        : Harry T. Roman et al.

It is certified that error appears in the above-identified patent and that said Letters Patent is hereby corrected as shown below:

On the title page, after "Assignee: New Jersey Institute of Technology (Newark, NJ)" insert --; Public Service Electric & Gas Company (Newark, NJ)--

Signed and Sealed this

Sixteenth Day of October, 2007

JON W. DUDAS
*Director of the United States Patent and Trademark Office*